United States Patent [19]
Vawter et al.

[11] Patent Number: 5,998,781
[45] Date of Patent: Dec. 7, 1999

[54] APPARATUS FOR MILLIMETER-WAVE SIGNAL GENERATION

[75] Inventors: G. Allen Vawter, Albuquerque; Vincent M. Hietala, Placitas; John C. Zolper, Albuquerque; Alan Mar, Albuquerque; John P. Hohimer, Albuquerque, all of N.Mex.

[73] Assignee: Sandia Corporation, Albuquerque, N.Mex.

[21] Appl. No.: 08/846,370

[22] Filed: Apr. 30, 1997

[51] Int. Cl.$^6$ ...................................................... G01J 1/04
[52] U.S. Cl. .......................................... 250/227.11; 372/94
[58] Field of Search ............................ 250/227.11, 214.1; 372/94

[56] References Cited

U.S. PATENT DOCUMENTS

| | | | |
|---|---|---|---|
| 4,907,234 | 3/1990 | Goldberg | 372/18 |
| 5,164,954 | 11/1992 | Su | 372/94 |
| 5,270,532 | 12/1993 | Hietala | 250/214.1 |
| 5,349,601 | 9/1994 | Hohimer et al. | 372/94 |
| 5,398,256 | 3/1995 | Hohimer et al. | 372/94 |

OTHER PUBLICATIONS

K. Y. Lau, "Narrow–Band Modulation of Semiconductor Lasers at Millimeter Wave Frequencies (>100 GHz) by Mode Locking," *IEEE Journal of Quantum Electronics*, vol. 26, pp. 250–261 (Feb. 1990).

D. J. Derickson, R. J. Helkey, A. Mar, J. G. Wasserbauer, Y. G. Wey, and J. E. Bowers, "Microwave and Millimeter Wave Signal Generation Using Mode–Locked Semiconductor Lasers with Intra–Waveguide Saturable Absorbers," in *1992 IEEE MTT–S International Microwave Symposium Digest,* edited by D. W. Reid (IEEE, Piscataway, NJ, 1992) pp. 753–756.

Y.–K. Chen and M.C. Wu, "Monolithic Colliding–Pulse Mode–Locked Quantum–Well Lasers," *IEEE Journal of Quantum Electronics*, vol. 28, pp. 2176–2184 (Oct. 1992).

K.S. Giboney, M.J.W. Rodwell and J.E. Bowers, "Traveling–Wave Photodetectors," *IEEE Photonics Technology Letters,* vol. 4, pp. 1363–1365 (Dec. 1992).

D.E. Bossi, R.W. Ade, R.P. Basilica, and J.M. Berak, "Regrowth–Free Waveguide–Integrated Photodetector with Efficient Total–Internal–Reflection Coupling," *IEEE Photonics Technology Letters,* vol. 5, pp. 166–169 (Feb. 1993).

J.P. Hohimer, G.A. Vawter, D.C. Craft and G.R. Hadley, "Improving the Performance of Semiconductor Ring Lasers by Controlled Reflection Feedback," *Applied Physics Letters,* vol. 61, pp. 1013–1015 (Aug. 31, 1992).

J.P. Hohimer, G.R. Hadley and G.A. Vawter, "Semiconductor Ring Lasers with Reflection Output Couplers," *Applied Physics Letters,* vol. 63, pp. 278–280 (Jul. 19, 1993).

(List continued on next page.)

*Primary Examiner*—Edward P. Westin
*Assistant Examiner*—Thanh X. Luu
*Attorney, Agent, or Firm*—John P. Hohimer

[57] ABSTRACT

An opto-electronic integrated circuit (OEIC) apparatus is disclosed for generating an electrical signal at a frequency ≧10 GHz. The apparatus, formed on a single substrate, includes a semiconductor ring laser for generating a continuous train of mode-locked lasing pulses and a high-speed photodetector for detecting the train of lasing pulses and generating the electrical signal therefrom. Embodiments of the invention are disclosed with an active waveguide amplifier coupling the semiconductor ring laser and the high-speed photodetector. The invention has applications for use in OEICs and millimeter-wave monolithic integrated circuits (MMICs).

28 Claims, 6 Drawing Sheets

OTHER PUBLICATIONS

J.P. Hohimer, D.C. Craft and G.A. Vawter, "Effect of the Y–Junction Output Coupler on the Lasing Threshold of Semiconductor Ring Lasers," *Applied Physics Letters,* vol. 63, pp. 1325–1327 (Sep. 6, 1993).

J.P. Hohimer and G.A. Vawter, "Passive Mode Locking of Monolithic Semiconductor Ring Lasers at 86 GHz," *Applied Physics Letters,* vol. 63, pp. 1598–1600 (Sep. 20, 1993).

V.M. Hietala, G.A. Vawter, T.M. Brennan, B.E. Hammons and W.J. Meyer, "Optical Generation of Radio–Frequency Power," Sandia National Laboratories Report No. SAND94–2761 (Nov. 1994).

K.S. Giboney, R.L. Nagarajan, T.E. Reynolds, S.T. Allen, R.P. Mirin, M.J.W. Rodwell and J.E. Bowers, "Travelling-–Wave Photodetectors with 172–GHz Bandwidth and 76–GHz Bandwidth–Efficiency Product," *IEEE Photonics Technology Letters,* vol. 7, pp. 412–414 (Apr. 1995).

V.M. Hietala, G.A. Vawter, T.M. Brennan and B.E. Hammons, "Traveling–Wave Photodetectors for High–Power, Large–Bandwidth Applications," *IEEE Transactions on Microwave Theory and Techniques,* vol. 43, pp. 2291–2298 (Sep. 1995).

L.Y. Lin, M.C. Wu, T. Itoh, T.A. Vang, R.E. Muller, D.L. Sivco and A.Y. Cho, "Velocity–Matched Distributed Photodetectors with High–Saturation Power and Large Bandwidth," *IEEE Photonics Technology Letters,* vol. 8, pp. 1376–1378 (Oct. 1996).

G.A. Vawter, A. Mar, V.M. Hietala, J.Zolper and J. Hohimer, "A Complete Monolithically–Integrated Circuit for All Optical Generation of Millimeter–Wave Frequencies," presented at the Optical Society of America Conference on Ultrafast Electronics and Optoelectronics '97, Incline Village, Nevada (Mar. 17–19, 1997).

G.A. Vawter, A. Mar, V.M. Hietala and J.Zolper, "Photonic Integrated Circuit for All–Optical Millimeter–Wave Signal Generation," Sandia National Laboratory Report No. SAND97–0615 (Mar. 1997).

APPARATUS FOR MILLIMETER-WAVE SIGNAL GENERATION

GOVERNMENT RIGHTS

This invention was made with Government support under Contract No. DE-AC04-94AL85000 awarded by the U.S. Department of Energy. The Government has certain rights in the invention.

FIELD OF THE INVENTION

The field of this invention relates in general to opto-electronic integrated circuits (OEICs), and in particular, to an opto-electronic integrated circuit that includes a mode-locked semiconductor ring laser optically coupled to a high-speed photodetector for the generation of an electrical output signal at a frequencies $\geq 10$ GHz.

BACKGROUND OF THE INVENTION

The millimeter-wave (MM-wave) region of the electromagnetic spectrum (defined herein to be radiation at wavelengths less than about 10 millimeters and having a frequency greater than about 30 GHz) is becoming increasingly important for many commercial and military applications. This is due to the lack of frequencies for new services in the microwave region of the spectrum, and also to the advantages to be gained from operation at higher frequencies. Furthermore, the MM-wave region of the electromagnetic spectrum is at present relatively uncrowded so that wider bandwidths are available for signal transmission, and there is reduced signal interference. A number of other advantages are to be gained by operating at MM wavelengths. The use of MM-waves allows transmitted signal beams to be more directive in nature, and also provides a greater image resolution for radar or ranging applications. Additionally, the use of MM-waves allows the use of reduced transmitter power levels and smaller antenna sizes. As a result, system size and weight can be greatly reduced compared to equivalent microwave systems. Furthermore, transmission at MM-wave frequencies is improved compared with microwave systems due to a relative immunity to weather conditions. At MM-wave frequencies, the transmitted data can be greatly increased, increasing the channel capacity for communications and thereby lowering network system cost. And for many MM-wave applications, the directionality and limited range of signal transmission means that the same frequency bands can be allocated to many different localities without interference.

MM-wave technology has both commercial and military applications. The near-term applications are primarily in the areas of radar and communications; although very-high-speed signal processing and computing are expected to become of increasing importance as millimeter-wave monolithic integrated circuit (MMIC) and opto-electronic integrated circuit (OEIC) technology is developed. Areas of commercial application include data and signal processing, intelligent automotive systems for traffic control and safety; imaging radar systems for aircraft landing under low visibility conditions; vision for autonomous robotic vehicles; intrusion alarms; local-area and satellite direct broadcast systems for computer networks and personal communications; and fiber-optic communication links. Military applications include radar fuses for projectiles; "smart" extended-range weapons; adverse-weather weapon systems; electronic warfare; phased-array radar; global positioning systems; and defense satellite communications.

The development of new and improved sources of MM-wave radiation is essential to the development and application of the technologies listed above and to he development of future MMIC and OEIC technology. The most commonly used solid-state electrical sources of MM-wave radiation today are negative differential resistance diodes such as Gunn and IMPATT diodes. IMPATT diodes have been the most powerful and efficient electrical MM-wave devices for the frequency range of 50 to 100 GHz. With increasing frequency above 50 GHz, however, the output power of IMPATT diodes decreases very rapidly due to a saturation of the ionization rate at high electric fields. Multi-quantum-well structures are being developed for IMPATT diodes to reduce this limitation; but these devices are presently limited to continuous-wave (cw) output powers of less than about 10 milliwatts at 100 GHz.

An advantage of the present invention is that an apparatus for generating a MM-wave electrical signal can be formed as a part of an OEIC or a MMIC wherein a mode-locked lasing pulse train at a frequency $\geq 10$ GHz is generated by a semiconductor ring laser and converted by a high-speed photodetector into an electrical output signal at the same frequency.

Another advantage of the present invention is that a frequency of the electrical signal to be generated can be controlled by providing a particular size for a semiconductor ring laser used to generate the mode-locked lasing pulse train.

A further advantage is that electrical feedback from the high-speed photodetector can be used to reduce any optical jitter in the mode-locked lasing pulse train to stabilize a frequency of oscillation of the electrical output signal from the high-speed photodetector.

Yet another advantage of the present invention is that an amplitude of the generated electrical signal can be controlled or increased by a optical waveguide amplifier located between the semiconductor ring laser and the high-speed photodetector and optically coupling the laser and photodetector.

Yet another advantage is that the apparatus of the present invention can be operated to generate an electrical signal at a frequency that is twice the frequency of the mode-locked lasing pulse train within the semiconductor ring laser.

These and other advantages of the apparatus of the present invention will become evident to those skilled in the art.

SUMMARY OF THE INVENTION

The present invention relates to an apparatus (i.e. a millimeter-wave electrical signal generator) for generating an electrical signal at a frequency $\geq 10$ GHz. The apparatus comprises a semiconductor ring laser formed on a semiconductor substrate for generating a continuous train of mode-locked lasing pulses at a frequency of the electrical signal to be generated and a high-speed photodetector located on the same substrate for detecting the train of mode-locked lasing pulses and generating the electrical signal therefrom. In preferred embodiments of the present invention, the electrical signal is generated at a millimeter-wave (MM-wave) frequency of 30 GHz or more.

The semiconductor ring laser comprises a plurality of semiconductor layers formed on the substrate (e.g. by epitaxial growth), including an active layer sandwiched between a pair of cladding layers, one of the cladding layers being n-type doped and the other of the cladding layers being p-type doped to form a semiconductor p-n or p-i-n junction about the active layer; a ring cavity formed in the plurality of semiconductor layers and including a saturable absorber portion and a gain portion; and electrodes for electrically activating the gain portion and the saturable absorber portion to generate the train of mode-locked lasing pulses. The ring cavity can be circular, elliptical or polygon-shaped.

In some preferred embodiments of the present invention, the ring cavity further includes at least one output coupler for coupling the train of mode-locked lasing pulses out of the ring cavity and into an optical waveguide disposed between the semiconductor ring laser and the high-speed photodetector. In these preferred embodiments of the present invention, the optical waveguide is preferably an active optical waveguide with gain for amplifying the train of mode-locked lasing pulses prior to detection and generation of the electrical signal. The optical waveguide can further be tapered or flared to increase a lateral dimension or width thereof with distance away from the semiconductor ring laser to provide an increased optical amplification prior to an onset of optical saturation.

In the apparatus of the present invention, the high-speed photodetector can comprise a waveguide photodetector or a traveling-wave photodetector. The high-speed photodetector is preferably designed for minimum capacitive loading and includes a low-loss transmission line preferably having about 50 Ω characteristic impedance.

The apparatus of the present invention in some preferred embodiments can be activated entirely with direct-current (DC) power supplies, generating an electrical signal at a predetermined frequency $\geq 10$ GHz. Generation of the electrical signal using only DC power supplies can be advantageous for eliminating electrical parasitics or cross-talk in an OEIC or MMIC.

Additional advantages and novel features of the present invention will become apparent to those skilled in the art upon examination of the following description, or can be learned by practice of the invention. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
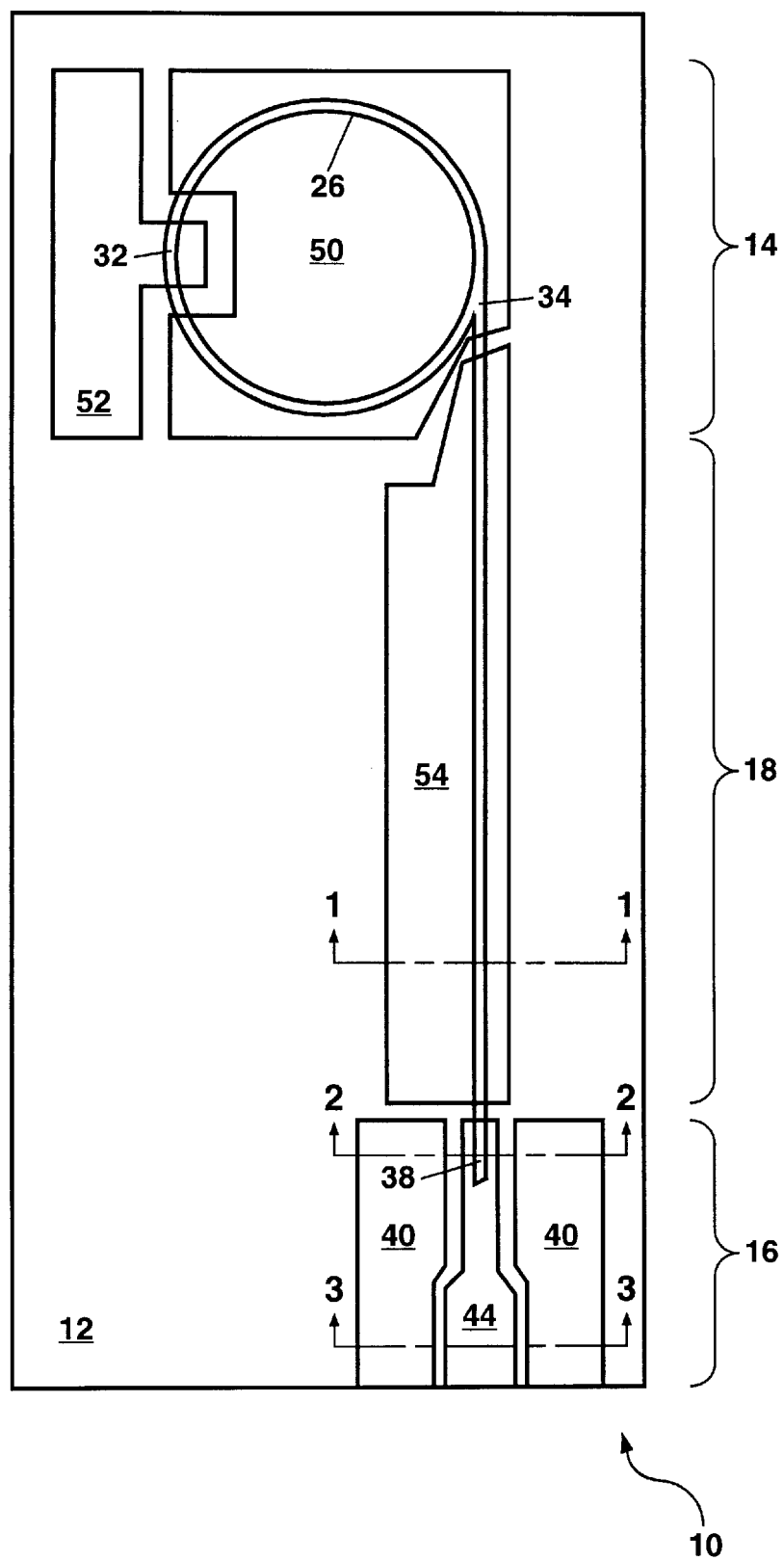
FIG. 1 shows a schematic diagram of a first embodiment of the apparatus of the present invention.

Referring to FIG. 1, there is shown a schematic diagram of a first embodiment of the present invention in the form of a millimeter-wave electrical signal generator 10. The millimeter-wave electrical signal generator has applications for use in an opto-electronic integrated circuit (OEIC) or a millimeter-wave monolithic integrated circuit (MMIC). The apparatus 10 comprises a semiconductor substrate 12 on which are formed a semiconductor ring laser 14 for generating a continuous train of mode-locked lasing pulses at a predetermined frequency of the electrical signal to be generated, and a high-speed photodetector 16 for detecting the train of lasing pulses and generating an electrical signal therefrom at a frequency $\geq 10$ GHz. In the first embodiment of the present invention in FIG. 1, the high-speed photodetector 16 is optically coupled to the semiconductor ring laser 14 by an optical waveguide 18.

In FIG. 1, the semiconductor substrate 12 can be a III–V compound semiconductor, and is preferably gallium arsenide (GaAs). The semiconductor substrate 12 in FIG. 1 is n-type doped to about $10^{18}$ cm$^{-3}$ (e.g. with silicon); whereas in other embodiments of the present invention, a p-type doped substrate 12 or an undoped (i.e. semi-insulating) substrate 12 can be used. The semiconductor substrate 12 as defined herein can include a buffer layer (not shown) generally of the same composition and doping type as the substrate for smoothing or conditioning an upper surface of the substrate 12 prior to growth of a plurality of semiconductor layers for forming the apparatus 10.

The plurality of semiconductor layers are formed on the substrate by an epitaxial growth process such as liquid phase epitaxy (LPE), metal-organic chemical vapor deposition (MOCVD), molecular beam epitaxy (MBE) or the like. The semiconductor layers in the first embodiment of the present invention in FIG. 1 can be used for forming each of the semiconductor ring laser 14, the high-speed photodetector 16 and the optical waveguide 18. In other embodiments of the present invention, the semiconductor ring laser 14, high-speed photodetector 16 and optical waveguide 18 can have different semiconductor layer structures with the semiconductor layer structure optimized for each of the laser, photodetector and optical waveguide.

Figure 2A:
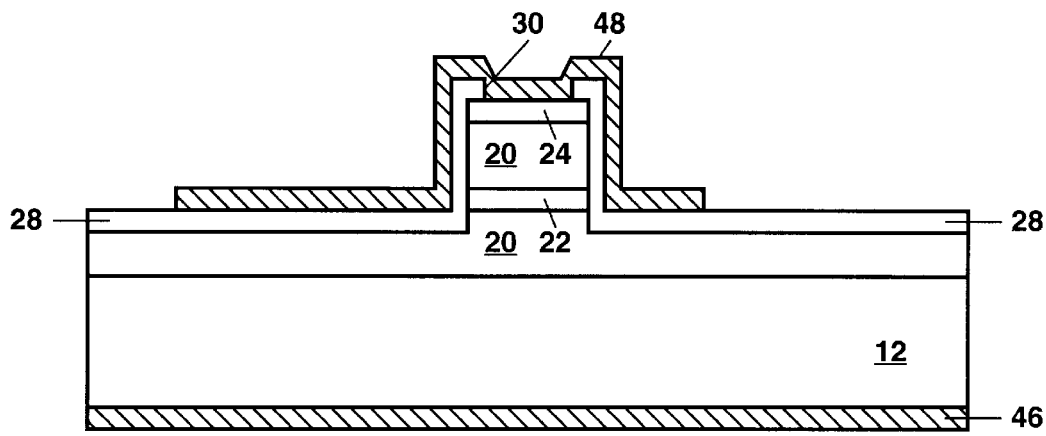
FIGS. 2a–2c show schematic cross-section views of various portions of the first embodiment of the invention in FIG. 1.

The arrangement of the plurality of semiconductor layers for forming the first embodiment of the present invention can be understood with reference to FIG. 2A which shows a schematic cross-section view taken along the line 1—1 in FIG. 1. In FIG. 2A, the semiconductor layers include a pair of cladding layers 20 sandwiched about an active layer 22. A cap layer 24 is provided above a last-grown of the cladding layers 20 for electrically contacting the semiconductor layers.

In FIG. 2A, the cladding layers 20 are oppositely doped (e.g. to about $5 \times 10^{17}$ cm$^{-3}$) to form a semiconductor p-n or p-i-n junction about the active layer 22. When the semiconductor substrate 12 is doped (e.g. n-type doped), then a first-grown of the cladding layers 20 is preferably doped with the same dopant type as the substrate 12; and the last-grown cladding layer 20 is oppositely doped. The cladding layers 20 are formed of III–V compound semiconductors with a layer thickness that is about 1 μm. The cladding layers 20 can comprise aluminum gallium arsenide (AlGaAs) when the active layer 22 is formed of GaAs. Alternately, the cladding layers 20 can comprise GaAs when the active layer 22 is formed of indium gallium arsenide (InGaAs).

The active layer 22 can comprise a bulk semiconductor layer having a uniform semiconductor alloy composition and a layer thickness of up to 150 nanometers or more. Alternately, the active layer can comprise one or more quantum-well layers, with each quantum-well layer having a thickness of typically 5–20 nanometers. When a plurality of quantum-well layers are used for the active layer 22, each pair of quantum-well layers can be separated by a barrier layer having an energy bandgap larger than the energy bandgap of the quantum-well layers. In the embodiment of the present invention in FIG. 1, the structure for the plurality of semiconductor layers is preferably a single-quantum-well graded-index separate-confinement-heterostructure (GRIN-SCH) wherein the cladding layers 20 include a compositionally-graded region on either side of a single-quantum-well active layer 22.

The cap layer 24 in FIG. 2A is generally about 20–50 nanometers thick and heavily doped (about $10^{19}$ cm$^{-3}$ or more) with a dopant type the same as the last-grown cladding layer 20. The semiconductor alloy composition of the cap layer 24 can be the same as that of the active layer 22.

Returning to FIG. 1, a ring cavity 26 is formed in the plurality of semiconductor layers. In the embodiment of the present invention in FIG. 1, the ring cavity is a circular cavity; whereas in other embodiments of the present invention, the ring cavity can be elliptical or polygon shaped (e.g. square, rectangular or triangular shaped, formed from a plurality of linear waveguides with reflecting mirrors at intersections of the linear waveguides).

The ring cavity 26 preferably has a rib waveguide structure formed from the semiconductor layers as shown in FIG. 2A. The rib waveguide structure has a predetermined width (e.g. about 1–10 μm) for forming single-mode or multi-mode waveguides. The rib waveguide structure is formed by providing a patterned etch mask (e.g. photoresist or photoresist overcoated by a transition metal for improved etch resistance) for defining the cavity 26 and then etching (e.g. dry etching such as reactive ion etching or reactive ion beam etching) down through the semiconductor layers to a predetermined depth near or through the active layer 22, depending upon a particular size and shape of the ring cavity 26. The etch depth determines a lateral index profile across the rib waveguide structure and a bending loss for propagation of lasing light in the cavity 26. For a small size circular ring cavity 26 (e.g. <1 millimeter diameter) the etch depth preferably extends through the active layer 22 as shown in FIG. 2A; whereas for a larger cavity size or where linear waveguides with reflecting mirrors are used, the etch depth can be reduced.

After etching the rib waveguide structure of the ring cavity 26 of the semiconductor ring laser 14, a thin insulating layer 28 (e.g. silicon dioxide) is deposited over the semiconductor layers and patterned to provide an opening 30 for electrically contacting the rib waveguide structure as shown in FIG. 2A.

A portion of the ring cavity 26 about 10–50 μm long is separately contacted to form a saturable absorber 32 for mode-locking the semiconductor ring laser 14 as shown in FIG. 1. The saturable absorber 32 when reverse biased by a DC voltage generates a continuous train of short duration (about 1 picosecond) lasing light pulses in the ring cavity 26, the remainder of which is operated forward-biased. The frequency, f, of the train of lasing pulses within the semiconductor ring laser 14 can be determined by the size of the ring cavity 26 (i.e. a transit time for the lasing pulses around the ring cavity) according to:

$$f = c/n_{eff} \times 1/\pi D$$

where c is the speed of light, $n_{eff}$ is a group effective refractive index of the rib waveguide structure in the ring cavity, and D is the diameter of the ring cavity 26. Using the above equation, ring-cavity sizes of 860 μm, 430 μm and 290 μm diameter can be used to generate continuous trains of mode-locked lasing pulses at frequencies of about 30 GHz, 60 GHz and 90 GHz, respectively. The pulse duration or pulse width, Δt, can be determined from the length, L, of the saturable absorber 32 according to:

$$\Delta t = n_{eff} L/c$$

In the first embodiment of the present invention in FIG. 1, the saturable absorber 32 is preferably operated as a passive mode locker by using a DC reverse-bias voltage. In other embodiments of the present invention, the saturable absorber 32 can be operated as an active mode locker by activating the saturable absorber with an alternating current (AC) reverse-bias voltage at the frequency of the electrical signal to be generated. Hybrid mode locking of the saturable absorber 32 is also possible wherein the reverse-bias voltage comprises superposed AC and DC signal components. For hybrid mode locking, the AC signal component can be derived from the electrical signal generated by the high-speed photodetector 16, thereby providing feedback which can reduce timing jitter in the lasing pulse train, thereby stabilizing the generated electrical signal.

The ring cavity 26 can further include a separately-contacted waveguide portion (not shown) for use as a tuning element for a fine tuning of the frequency, f, of the mode-locked lasing pulse train. The tuning element when biased at a predetermined forward-bias current or reverse-bias voltage can be used to locally alter the refractive index, $n_{eff}$, within the separately-contacted waveguide portion, thereby altering a total path length around the ring cavity 26 for fine tuning or control of the frequency, f, of the generated electrical signal.

The semiconductor ring laser 14 in FIG. 1 is provided with a branching-waveguide Y-junction output coupler 34 located at a position on the ring cavity 26 opposite the saturable absorber 32. The branching-waveguide output coupler 34 can be formed from a linear waveguide which intersects the ring cavity 26 tangentially. The linear waveguide generally has the same rib waveguide structure and width as the ring cavity 26 and can extend outward from the ring cavity to form the optical waveguide 18.

Figure 4:
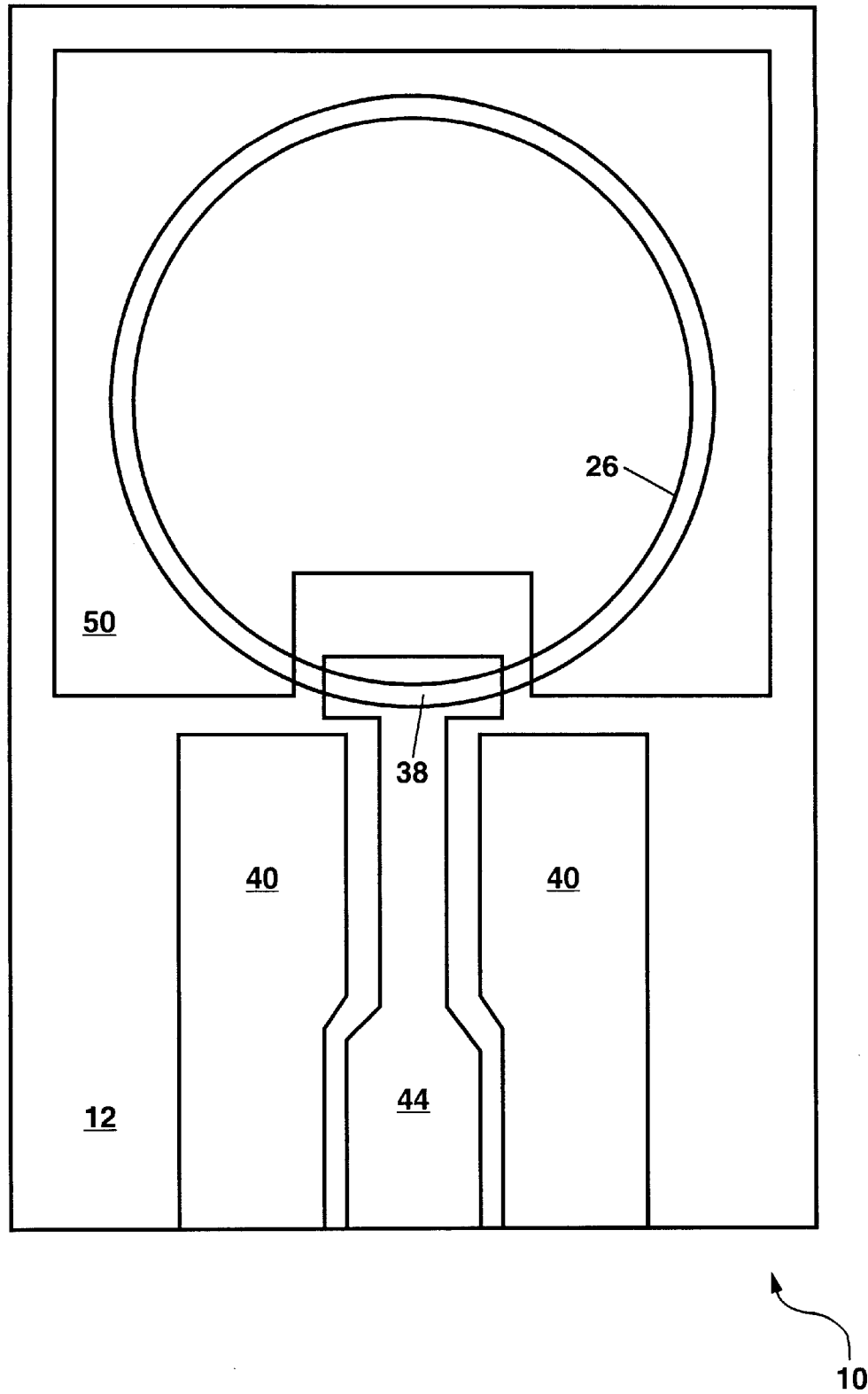
FIG. 4 shows a schematic diagram of a second embodiment of the apparatus of the present invention.
Figure 5:
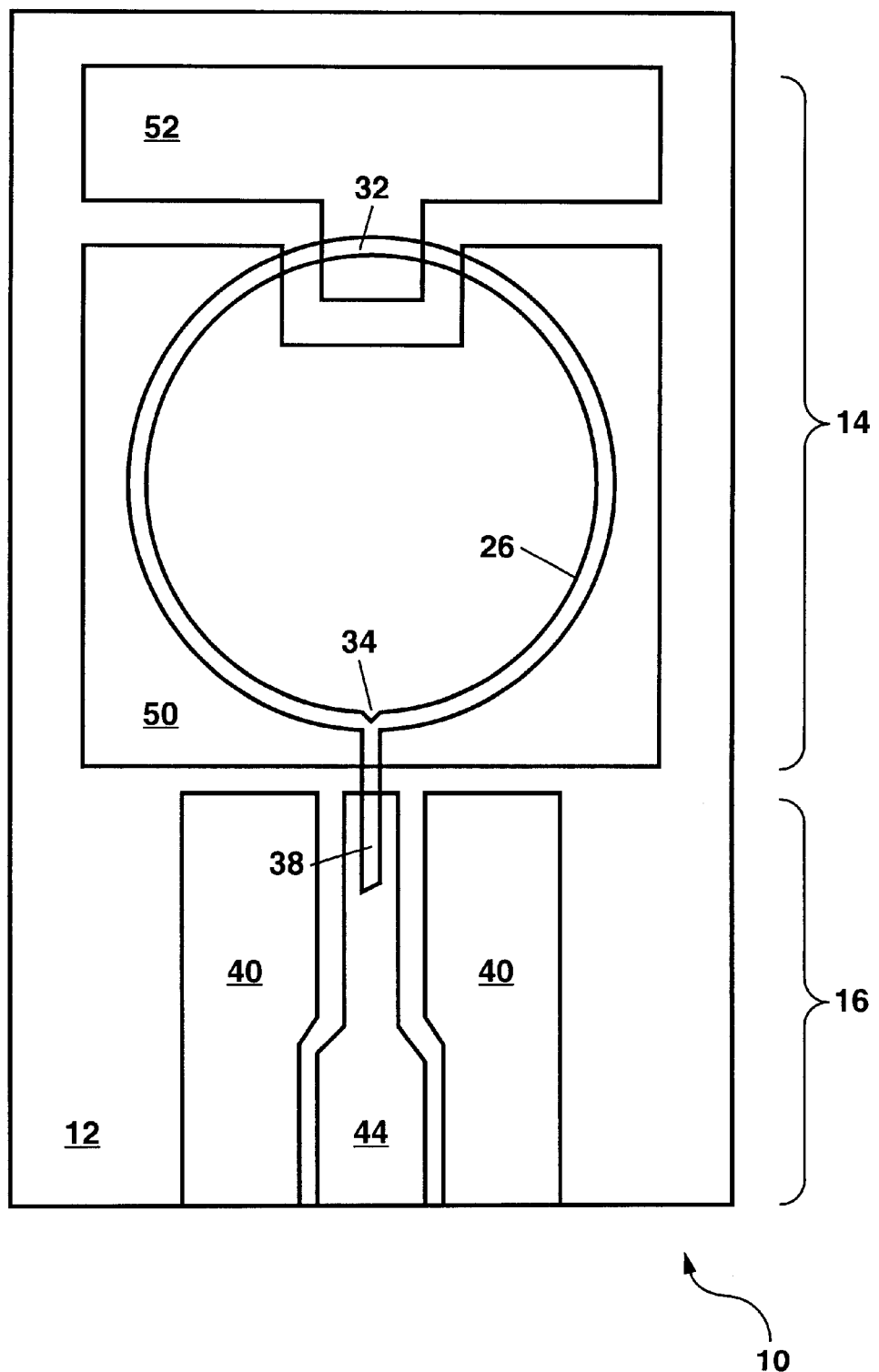
FIG. 5 shows a schematic diagram of a third embodiment of the apparatus of the present invention.

In other embodiments of the present invention, other types of output couplers 34 can be used including a reflection output coupler as shown in FIG. 5. In some embodiments of the present invention, more than one output coupler can be provided. Finally, it is possible to form the apparatus 10 of the present invention without any output coupler at all as shown in FIG. 4.

In the first embodiment of the present invention in FIG. 1, the output coupler 34 couples the mode-locked lasing pulse train from the semiconductor ring laser 14 into an optical waveguide 18 of a predetermined length (e.g. 0.5–5 mm long) and therefrom to the high-speed photodetector 16. The optical waveguide 18 can be formed at the same time as the ring cavity 26 with the same rib waveguide structure (see FIG. 2A). Although the optical waveguide 18 can be formed as a passive waveguide with no applied electrical bias, the optical waveguide 18 is preferably electrically contacted so that it can be forward biased to form an active optical waveguide operating at transparency, or with optical gain. By forward biasing the optical waveguide 18 to transparency (e.g. about 100 A·cm$^{-2}$ current density for a GRIN-SCH structure), any optical losses therein are substantially reduced. The optical waveguide 18 can also be used as an optical amplifier by increasing the current density above transparency. Use of the optical waveguide as an optical amplifier is advantageous for increasing or controlling the intensity of the electrical signal generated from the lasing pulse train by the high-speed photodetector 16. The optical waveguide 18 can include one or more saturable absorption regions or diffraction gratings (not shown) for shaping the lasing pulse train, for reducing any back reflection of the lasing pulse train into the semiconductor ring laser 14, or for reducing a level of spontaneous emission from being coupled back into the ring cavity 26 from the optical waveguide 18.

In the first embodiment of the present invention in FIG. 1, the high-speed photodetector 16 comprises a waveguide photodetector 38. The high-speed photodetector 16 can further include electrodes that form a high-speed (~50 Ω)

transmission line for routing the generated electrical signal to other portions of the apparatus 10, to circuitry formed on the substrate 12, or to contact pads for off-chip use.

Figure 2B:
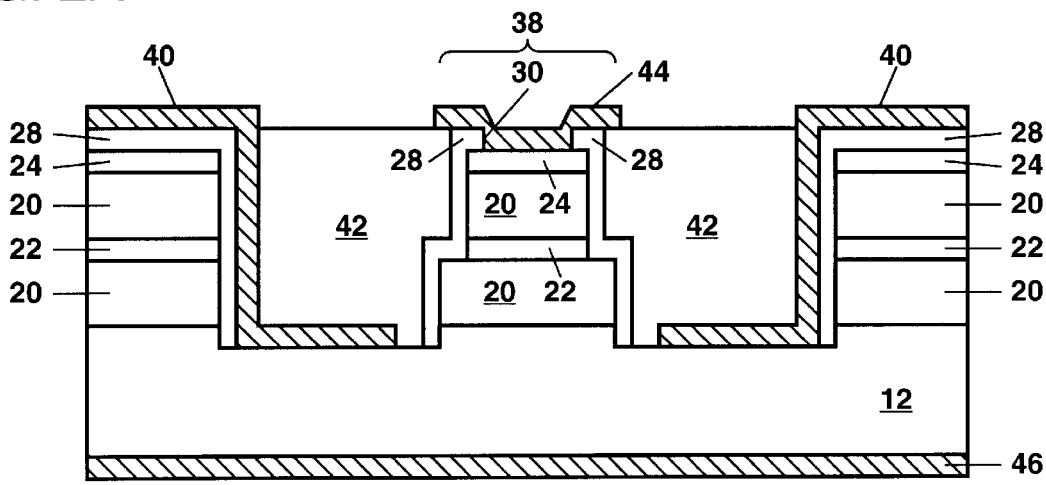

FIG. 2B shows a schematic cross-section view of the waveguide photodetector 38 taken along the line 2—2 in FIG. 1. In FIG. 2B, the waveguide photodetector 38 has the same semiconductor layer structure as the semiconductor ring laser 14, and is designed for minimum capacitive loading from the substrate 12 (e.g. an n-type doped substrate). The waveguide photodetector 38 can be sized to provide a predetermined frequency response matched to the frequency, f, of the mode-locked lasing pulse train within the semiconductor ring laser 14, thereby preventing detection of any unwanted spectral content above the predetermined frequency, f.

Figure 2C:
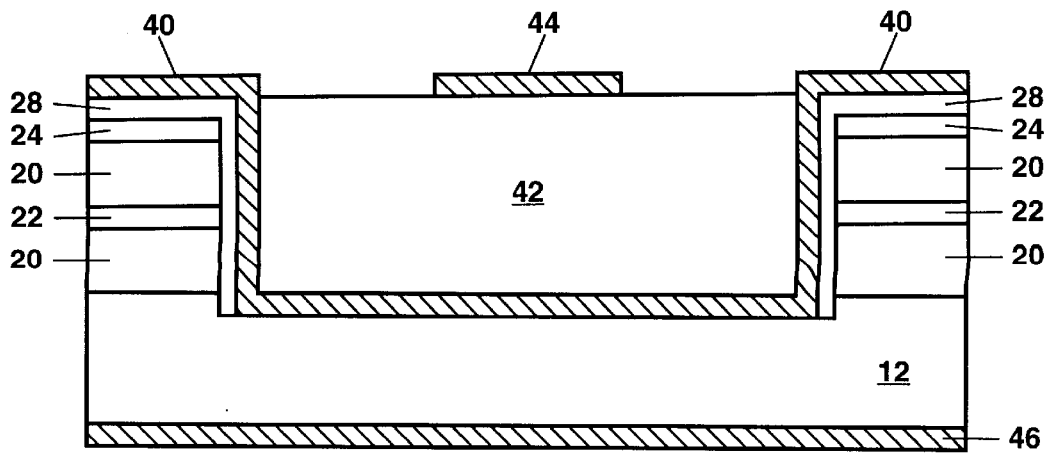

A two-step etch process is used to form the waveguide photodetector 38 which generally has a small active area (e.g. 6 $\mu$m wide×10–200 $\mu$m long depending on the frequency, f). In a first etch step also used to form the ring cavity 26 and the optical waveguide 18, an upper portion of the waveguide photodetector 38 can be formed. Then a second etch step can be used to etch down through the remaining semiconductor layers and into the substrate 12 forming a trench (about 10 $\mu$m deep) on either side of the waveguide photodetector 38 to allow for deposition of a patterned ground-plane electrode 40 and insulating layer 28. A dielectric material 42 (e.g. a spin-on photodefinable polyimide) is deposited in the etched trenches as shown in FIGS. 2B and 2C. The waveguide photodetector 38 and associated high-speed transmission line are completed by forming an opening 30 above the waveguide photodetector and depositing and patterning a center electrode 44 of the high-speed transmission line which is supported by the dielectric material 42. In FIG. 2C, the high-speed transmission line has a center electrode width of 12 $\mu$m, with the center electrode 44 being laterally spaced on each side from the ground-plane electrode 40 by 5 $\mu$m, and further being vertically spaced from the ground-plane electrode by a 10-$\mu$m thickness of dielectric material 42. These dimensions of the high-speed transmission line were selected to provide a low loss and about 50 $\Omega$ characteristic impedance.

In the first embodiment of the present invention in FIG. 1, an end of the waveguide photodetector 38 opposite the optical waveguide 18 is etched at an angle of about 5–10° to reduce any back reflection of the lasing pulse train into the semiconductor ring laser 14. The calculated optical absorption in the reverse-biased waveguide photodetector 38 is about 430 dB/cm so that about 10% of the light in the lasing pulse train will be absorbed by a waveguide photodetector that is 10 $\mu$m long, about 55% of the light will be absorbed by an 80-$\mu$m-long waveguide photodetector, and about 84% of the light will be absorbed by a 180-$\mu$m-long waveguide photodetector. Absorption of the lasing pulse train in the waveguide photodetector 38 produces electrons and holes to generate a electrical photocurrent signal (i.e. the electrical signal) with modulation at the frequency, f, of the lasing pulse train. The exact length selected for the waveguide photodetector will depend upon the frequency, f, of the electrical signal to be generated. In some embodiments of the present invention, the optical waveguide 18 can extend beyond the waveguide photodetector 38 so that the mode-locked lasing pulse train can be directed off-chip at a cleaved end facet, or amplified and routed elsewhere on the substrate 12 for optical use or for generation of additional electrical signals (e.g. an optically distributed clock).

To complete formation of the apparatus 10, a full-surface lower electrode 46 (e.g. Au—Ge—Ni) is deposited below the semiconductor layers and preferably below the substrate 12; and an upper electrode 48 (e.g. Ti—Au) is deposited above the semiconductor layers and the insulating layer 28 and patterned to form separate bonding pads 50, 52 and 54, for the ring cavity 26, the saturable absorber 32 and the optical waveguide 18, respectively. In some embodiments of the invention, the lower electrode 46 can be formed above the substrate by depositing the electrode 46 in a region wherein the semiconductor layers are removed down to the first-grown cladding layer 20 (e.g. in the case of a semi-insulating substrate 12) or down to the substrate (e.g. for a doped substrate 12). The completed apparatus 10 can be mounted on a heat sink. For testing, electrical probe connections can also be made to electrodes 40 and 44; whereas in an OEIC or MMIC chip, the generated electrical signal can be routed by the high-speed transmission line to circuitry on the chip.

Figure 3:
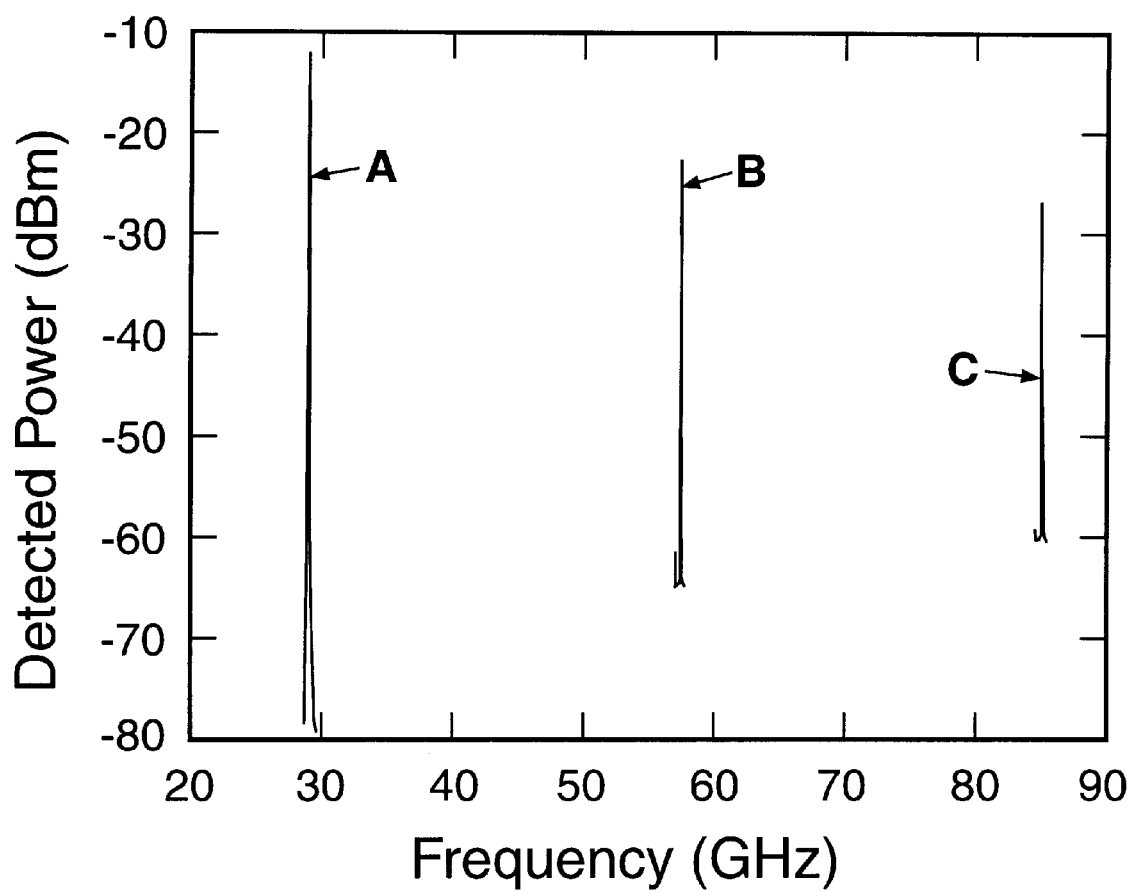
FIG. 3 shows curves for the measured frequency and power of the electrical signal generated by the first embodiment of the apparatus in FIG. 1 for various ring-cavity sizes.

FIG. 3 shows the measured frequency and detected power of the generated electrical signal from millimeter-wave electrical signal generators 10 formed according to the first embodiment of the present invention with a 1-mm-long optical waveguide 18. Curves "A", "B" and "C" in FIG. 3 are from signal generators 10 having ring-cavity sizes of 860 $\mu$m, 430 $\mu$m and 290 $\mu$m, respectively.

Each of the millimeter-wave electrical signal generators 10 whose characteristics are shown in FIG. 3 was formed on an n-type GaAs substrate 12, with a GRIN-SCH layer structure including a pair of cladding layers 20 sandwiched about a 10-nanometer-thick GaAs single-quantum-well active layer 22. Each of the cladding layers 20 includes a 200-nanometer-thick undoped composition-graded region adjacent to the single-quantum-well active layer 22 (i.e. graded from $Al_{0.6}Ga_{0.4}As$ on the side of each cladding layer 20 away from the active layer 22 to $Al_{0.3}Ga_{0.7}As$ on the side of each cladding layer 20 in contact with the active layer 22). The rib waveguide structure used for the ring cavity 26, saturable absorber 32, optical waveguide 18 and waveguide photodetector 38 is 6 $\mu$m wide, and is formed by chlorine reactive ion beam etching.

Localized ion implantation of the cap layer 24 and the last-grown cladding layer 20 provides electrical isolation in unmetallized regions of the apparatus 10 separating the contacted ring cavity 26, the saturable absorber 32, the optical waveguide 18 and the waveguide photodetector 38. After an ion implantation step, a rapid thermal annealing step (e.g. 30 seconds at 850° C. for oxygen ions) is used to recover optical transparency in implanted regions of the rib-waveguide structure while retaining a high resistivity for electrical isolation.

Since a GRIN-SCH layer structure is used for the first embodiment of the present invention in FIG. 1, a waveguide photodetector 38 is preferred for the high-speed photodetector 16. In other embodiments of the present invention, the highspeed photodetector 16 can comprise a traveling-wave photodetector having a velocity-matched structure similar to that disclosed by Hietala in U. S. Pat. No. 5,270,532 which is incorporated herein by reference. Formation of a traveling-wave photodetector requires that the mode-locked lasing pulse train be substantially velocity-matched to the generated electrical signal; and this is not possible with the GRIN-SCH layer structure used for initial testing of the first embodiment of the present invention. The GRIN-SCH semiconductor layer structure of these initial devices was optimized for operation of the semiconductor ring laser 14 and waveguide amplifier 18. Thus, the semiconductor layer structure could not provide a depletion width sufficiently large to reasonably form a velocity-matched traveling-wave photodetector. In other embodiments of the present invention, the semiconductor layer structure can be designed with a bulk or multi-quantum-well active layer 22 to provide a larger depletion width for formation of a traveling-wave photodetector. Alternately, a separate semiconductor layer structure can be grown (e.g by epitaxial regrowth in an etched region adjacent to an end of the optical waveguide 18 wherein the high-speed photodetector 16 is to be located) that is optimized for formation of a traveling-wave photodetector.

In testing the first embodiment of the millimeter-wave electrical signal generator 10 in FIG. 1, the semiconductor ring laser 14 can be initially operated in a continuous-wave (cw) mode by applying a first forward-bias current between bond pad 50 and lower electrode 46. The first forward-bias current is adjusted to a predetermined level to produce cw lasing action within the ring cavity 26. Characterization of the threshold current for cw lasing in the ring cavity 26 can be performed by applying a reverse-bias voltage of a few volts between bond pad 54 and lower electrode 46 so that the optical waveguide 18 functions as a DC photodetector and provides an output signal responsive to cw lasing in the ring cavity 26. However, under normal operation, the optical waveguide 18 is operated with a second forward-bias current to form an active waveguide with optical gain.

To activate the semiconductor ring laser 14 for mode-locking, a DC saturable-absorber reverse-bias voltage of a few volts is applied across bond pad 52 and lower electrode 46. The exact reverse-bias voltage for producing the continuous train of mode-locked lasing pulses can be determined by measuring the generated electrical signal in the high-speed photodetector 16 using a spectrum analyzer connected to the electrodes 40 and 44 by a coplanar high-frequency probe. To do this, a photodetector reverse-bias voltage is applied between electrodes 40 and 44 to activate the waveguide photodetector 38. Table 1 shows the various operating currents and voltages for the first embodiment of the apparatus 10 for ring-cavity diameters of 860 $\mu$m, 430 $\mu$m and 290 $\mu$m. Under the conditions of Table 1, curves "A", "B" and "C" in FIG. 3 were

TABLE 1

Operating Currents and Voltages

| Ring-Cavity Size ($\mu$m) | First Forward-Bias Current (Ring Cavity) (mA) | Second Forward-Bias Current (Optical Waveguide) (mA) | Saturable-Absorber Reverse-Bias Voltage (V) | Photodetector Reverse-Bias Voltage (V) |
|---|---|---|---|---|
| 860 | 130 | 70 | −2.9 | None |
| 430 | 180 | 70 | −3.3 | −18 |
| 290 | 192 | 70 | −3.4 | −17 | recorded. Curve "A" for a 860-$\mu$m-diameter ring-cavity device 10 was obtained by using the saturable absorber as a photodetector, with the generated electrical signal being taken directly from the saturable absorber bonding pad 52 (i.e. across bond pad 52 and lower electrode 46). This mode of operation of the apparatus 10 is described in further detail hereinafter with respect to a second embodiment of the apparatus 10 of the present invention. For curve "A", the generated electrical signal has a detected power of −12 dBm, and a frequency of 29.1 GHz.

Curves "B" and "C" in FIG. 3 were recorded with the generated electrical signal being taken at the high-speed transmission line output of the waveguide photodetector 38 (i.e. across electrodes 40 and 44). Since the generated electrical signals in curves "B" and "C" are at frequencies above 50 GHz, a harmonic frequency mixer was used at the input of the spectrum analyzer to measure the electrical signals by heterodyne detection. Curve "B" for a 430-$\mu$m-diameter device 10 shows the generation of an electrical signal at 57.5 GHz with −23 dBm of detected power; and curve "C" for a 290-$\mu$m-diameter device 10 shows the generation of an electrical signal at 85.2 GHz with −27 dBm of detected power. In FIG. 3, each of the generated electrical signals has a linewidth in the range of 0.3–1.0 MHz, with the linewidth being primarily determined by timing jitter in the mode-locked lasing pulse train.

Gain in the 1-mm-long active optical waveguide 18 of FIG. 1 is about 6–8 dB when the second forward-bias current is 70 mA. The optical gain can be further increased by lengthening the optical waveguide 18 and/or by laterally flaring or tapering the optical waveguide 18 in the direction away from the ring cavity 26. Such a tapered optical waveguide amplifier 18 is advantageous for providing an increased optical gain prior to an onset of optical saturation. A tapered optical waveguide amplifier 18 also allows the width of the waveguide photodetector 38 to be increased. Alternately, a tapered optical waveguide amplifier 18 can be used with a plurality of waveguide photodetectors 38 formed in parallel and spaced across the width of the flared waveguide amplifier 18 with a common center electrode 44 for summing the electrical signals generated by each waveguide photodetector 38.

FIG. 4 shows a schematic diagram of a second embodiment of the millimeter-wave electrical signal generator 10 of the present invention. The second embodiment of the present invention comprises a semiconductor ring laser 14 having a ring cavity 26 without any output coupler (i.e. a closed-ring cavity). The ring cavity 26 can be circular as shown in FIG. 4, or elliptical or polygon shaped (e.g. square or rectangular). The ring cavity 26 can be formed as described heretofore with a rib waveguide structure as shown in FIG. 2A, and with electrodes 46 and 48 for activating the semiconductor ring laser 14.

In FIG. 4, a high-speed photodetector comprising a waveguide photodetector 38 is located within the ring cavity 26. The waveguide photodetector 38 can have with a structure similar to that of FIG. 2B except that an optical axis for light propagation in the photodetector 38 is substantially normal to a longitudinal axis of the high-speed transmission line. Photodetector 38 can be contacted by a T-shaped extension of the center electrode 44 as shown in FIG. 4.

Reverse-biasing the waveguide photodetector 38 in FIG. 4 generates a saturable absorption within the ring cavity 26, thereby converting an otherwise cw lasing of the semiconductor ring laser 14 into a continuous train of mode-locked pulses (i.e. the waveguide photodetector 38 in FIG. 4 acts in a manner similar to the saturable absorber 32 in FIG. 1). Furthermore, the reverse-biased waveguide photodetector 38 detects a portion of the mode-locked lasing pulse train traveling therein to generate an electrical signal at the frequency of the mode-locked lasing pulse train which can be routed on- or off-chip by the high-speed transmission line formed by electrodes 40 and 44.

Although the second embodiment of the present invention does not allow for optical amplification of the mode-locked lasing pulse train prior to detection, the second embodiment of the invention can be advantageous in terms of simpler construction, reduced size and reduced power consumption. Losses in the ring cavity of the second embodiment in FIG. 4 are reduced since no output coupler is used. These reduced losses can allow lasing in a smaller sized cavity 26 (down to about 50$\mu$m diameter) for the generation of higher frequencies of the electrical signal since both the ring cavity loss and output coupler loss increase with decreasing size of the ring cavity 26. Additionally, a threshold current for lasing in the closed-ring cavity 26 of FIG. 4 will be reduced as compared with a ring cavity that includes an output coupler. This results in more lasing power in the mode-locked pulse train circulating in the closed-ring cavity 26 at a given drive current (i.e. the first forward-bias current). Finally, since the mode-locked pulse train can be detected in each of two ring directions (i.e. a clockwise-propagating pulse train and a counterclockwise-propagating pulse train), the detected power in the second embodiment of the present invention is further increased. (In a ring cavity, the mode-locked lasing pulse train in the clockwise and counterclockwise directions are generally synchronized producing so-called colliding-pulse mode locking which stabilizes the lasing pulse train and produces the shortest pulse width.) FIG. 5 shows a schematic diagram of a third embodiment of the apparatus of the present invention. The third embodiment of the present invention can be formed similarly to the first embodiment described heretofore, except that a reflection output coupler 34 is substituted for the Y-junction output coupler in FIG. 1. In FIG. 5, the reflection output coupler 34 can be formed by etching at least one 45° reflecting mirror that extends partway into the rib waveguide structure to reflect a portion of the mode-locked lasing pulse train out of the ring cavity 26. Fabrication of the reflection output coupler 34 can be accomplished by providing a patterned etch mask that incorporates the design of each 45° reflecting mirror and etching the mirror during formation of the rib waveguide structure as described heretofore. Although the reflection output coupler 34 is shown with a circular ring cavity 26, in other embodiments of the invention a reflection output coupler can be used with an elliptical or polygonal ring cavity 26.

A reflection output coupler 34 is advantageous in providing a reduced cavity loss and an increased output power compared to a Y-junction output coupler. To obtain the maximum output-coupled power in the mode-locked lasing pulse train, the reflection output coupler 34 is preferably shaped to provide a pair of oppositely oriented 45° reflecting mirrors as shown in FIG. 5 so that a mode-locked lasing pulse train is coupled out of the ring cavity 26 in each of the clockwise and the counterclockwise ring directions. The clockwise and counterclockwise mode-locked lasing pulse trains are synchronized in time by locating the reflection output coupler 34 at a location on the ring cavity opposite the saturable absorber 32.

In FIG. 5, the lasing pulse train is optically coupled from the semiconductor ring laser 14 into the high-speed photodetector 16 which can comprise a waveguide photodetector 38 as shown, or a traveling-wave photodetector. Generation of the electrical signal at a frequency $\geq 10$ GHz is accomplished as described heretofore by providing the first forward-bias current to the ring cavity 26, the saturable-absorber reverse bias voltage and the photodetector reverse-bias voltage. The generated electrical signal can be routed to circuitry on the substrate 12 by a high-speed transmission line comprising the ground electrode 40 and center electrode 44.

Figure 6:
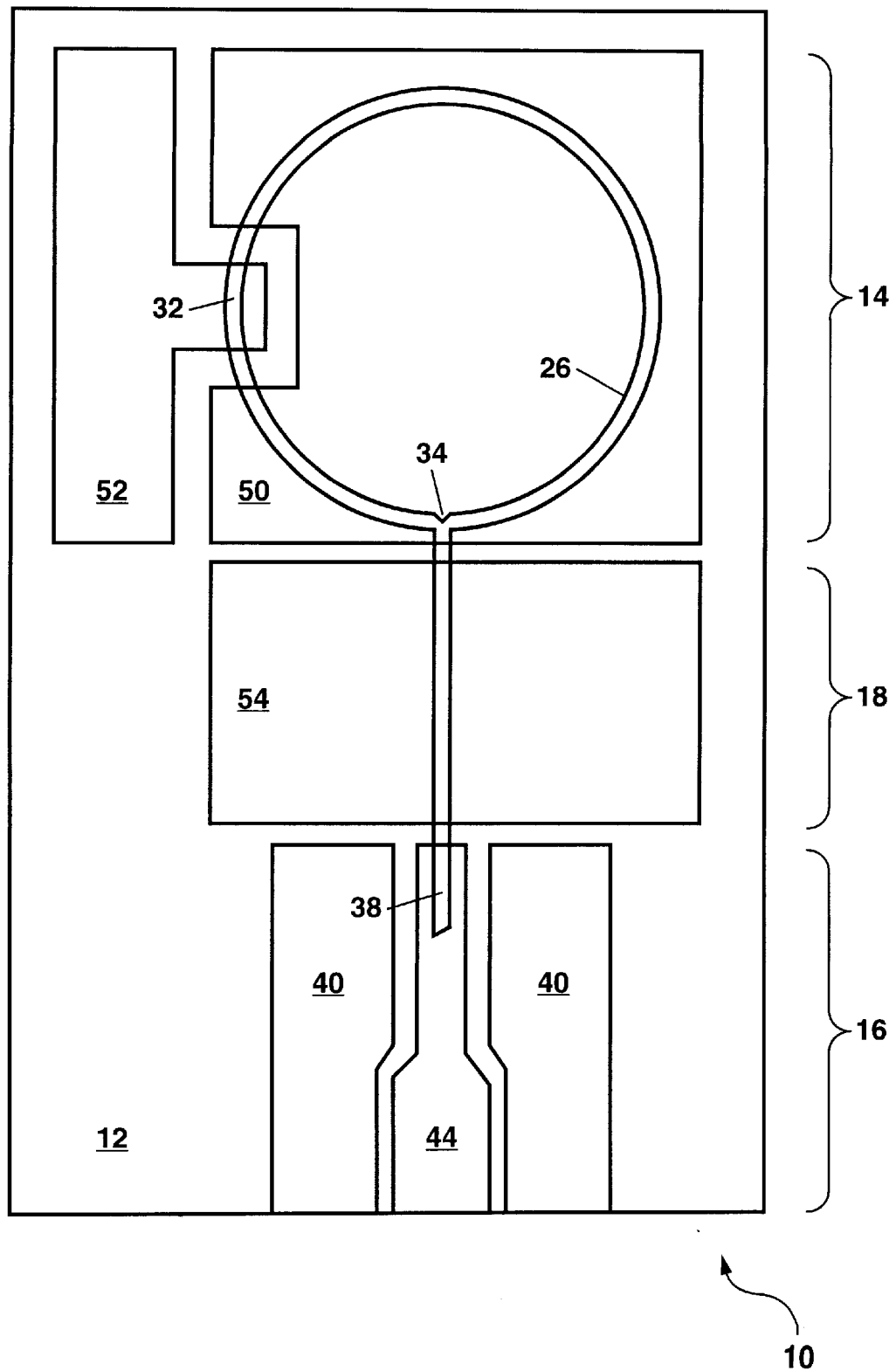
FIG. 6 shows a schematic diagram of a fourth embodiment of the apparatus of the present invention.

FIG. 6 shows a schematic diagram of a fourth embodiment of the apparatus of the present invention. The fourth embodiment of the present invention can be formed in a manner similar to the embodiments of the invention described heretofore. The fourth embodiment of the invention includes an optical waveguide 18 which can be forward biased to provide optical gain to increase the power in the mode-locked lasing pulse train prior to detection by the high-speed photodetector 16.

In FIG. 6, the output coupler 34 is located at a position on the ring cavity 26 that is 90° around the cavity from the saturable absorber 32. This positioning of the output coupler 34 and the saturable absorber 32 results in the clockwise-and counterclockwise-propagating mode-locked lasing pulse trains being offset in time by one-half period. As a result, the two counterpropagating mode-locked lasing pulse trains when coupled out of the ring cavity 26 at output coupler 34 are interleaved to form a single mode-locked pulse train at twice the frequency of the pulse trains propagating within the ring cavity 26. This is advantageous in that the frequency of the generated electrical signal in the high-speed photodetector 16 is now twice that in the ring cavity 26. Thus, the frequency of the generated electrical signal can be doubted without changing the size of the ring cavity 26.

For other embodiments of the present invention, a pair of saturable absorbers 32 can be provided within the ring cavity 26 of the semiconductor ring laser 14 with separate contact pads 52. One of the saturable absorbers 32 can be located opposite the reflection output coupler 32; and the other saturable absorber 32 can be located at an angle of 90° around the ring cavity from the output coupler 32. This arrangement can be used to switchably generate electrical signals at frequencies, f or 2f, by activating one or the other of the saturable absorbers 32 with a reverse-bias voltage of a few volts. (The other saturable absorber can be left unbiased or otherwise forward-biased at a current density similar to that of the ring cavity 26 to provide additional optical gain within the ring cavity.)

The matter set forth in the foregoing description and accompanying drawings is offered by way of illustration only and not as a limitation. The apparatus 10 of the present invention is useful as a replacement for negative-resistance electrical devices and allowing the formation of OEICs or MMICs having an on-chip generator of electrical signals at a frequency $\geq 10$ GHz to provide an internal oscillator or a clock for use therein. The actual scope of the invention is intended to be defined in the following claims when viewed in their proper perspective based on the prior art.

What is claimed is:

1. Apparatus for generating an electrical signal at a frequency $\geq 10$ GHz, comprising:
    (a) laser means formed on a substrate comprising a ring cavity for generating a continuous train of mode-locked lasing pulses at the frequency of the electrical signal; and
    (b) photodetector means located on the substrate proximate to the laser means for detecting the train of lasing pulses and generating the electrical signal therefrom.

2. The apparatus of claim 1 wherein the laser means comprises a semiconductor ring laser.

3. The apparatus of claim 2 wherein the semiconductor ring laser comprises:
    (a) a plurality of semiconductor layers formed on the substrate, including a pair of cladding layers sandwiched about an active layer, one of the cladding layers being n-type doped and the other of the cladding layers being p-type doped to form a semiconductor junction about the active layer;
    (b) a ring cavity formed in the plurality of semiconductor layers, and including a saturable absorber portion and a gain portion; and
    (c) electrodes for electrically activating the gain portion and the saturable absorber portion to generate the train of mode-locked lasing pulses.

4. The apparatus of claim 3 wherein the photodetector means is formed from the plurality of semiconductor layers.

5. The apparatus of claim 3 wherein the active layer includes at least one quantum-well layer.

6. The apparatus of claim 3 wherein the saturable absorber is a passive saturable absorber activated by a direct-current reverse-bias voltage.

7. The apparatus of claim 3 wherein the saturable absorber is an active or hybrid saturable absorber.

8. The apparatus of claim 3 wherein the ring optical cavity further includes at least one output coupler for coupling the lasing pulses out of the ring cavity.

9. The apparatus of claim 8 wherein the output coupler is located at a position on the ring optical cavity opposite the saturable absorber.

10. The apparatus of claim 8 wherein the output coupler is located at a position on the ring optical cavity 90 degrees around the cavity from the saturable absorber.

11. The apparatus of claim 8 wherein the output coupler is a branching-waveguide output coupler.

12. The apparatus of claim 8 wherein the output coupler is a reflection output coupler.

13. The apparatus of claim 1 further including an optical waveguide for coupling the train of mode-locked lasing pulses from the laser means to the photodetector means.

14. The apparatus of claim 13 wherein the optical waveguide is a passive optical waveguide.

15. The apparatus of claim 13 wherein the optical waveguide is an active optical waveguide.

16. The apparatus of claim 15 wherein the active optical waveguide forms an optical waveguide amplifier.

17. The apparatus of claim 1 wherein the photodetector means comprises a waveguide photodetector.

18. The apparatus of claim 1 wherein the photodetector means comprises a traveling-wave photodetector.

19. A millimeter-wave electrical signal generator, comprising:
(a) a semiconductor ring laser formed on a substrate and having a ring cavity and passive mode-locking means for generating a train of mode-locked lasing pulses; and
(b) a waveguide photodetector formed on the substrate and optically coupled to the semiconductor laser for detecting the train of lasing pulses and generating therefrom an electrical signal at a millimeter-wave frequency.

20. The apparatus of claim 19 wherein the waveguide photodetector is located proximate to the semiconductor ring laser and coupled thereto by an optical waveguide.

21. The apparatus of claim 20 wherein the optical waveguide is a passive optical waveguide.

22. The apparatus of claim 20 wherein the optical waveguide is an active optical waveguide with gain.

23. A millimeter-wave electrical signal generator, comprising:
(a) a semiconductor ring laser formed on a substrate and having a ring cavity and passive mode-locking means for generating a train of mode-locked lasing pulses; and
(b) a waveguide photodetector formed on the substrate and located within the ring cavity and optically coupled to the semiconductor laser for detecting the train of lasing pulses and generating therefrom an electrical signal at a millimeter-wave frequency.

24. A millimeter-wave electrical signal generator, comprising:
(a) a semiconductor ring laser formed on a substrate and having a ring cavity and passive mode-locking means for generating a train of mode-locked lasing pulses;
(b) a waveguide photodetector formed on the substrate proximate to the semiconductor laser; and
(c) an active optical waveguide with gain formed on the substrate and optically coupling the train of mode-locked lasing pulses from the semiconductor ring laser into the waveguide photodetector to an electrical signal at a millimeter-wave frequency from the train of mode-locked lasing pulses, the active optical waveguide being tapered with a width that increases with distance away from the semiconductor ring laser.

25. A method of generating an electrical signal at a frequency $\geq 10$ GHz, comprising steps for:
(a) generating in a ring cavity on a substrate a continuous train of mode-locked lasing pulses at the frequency of the electrical signal; and
(b) detecting with a high-speed photodetector on the substrate the continuous train of mode-locked lasing pulses and generating the electrical signal therefrom.

26. A method of generating an electrical signal at a frequency $\geq 10$ GHz, comprising steps for:
(a) generating in a ring cavity on a substrate a continuous train of mode-locked lasing pulses at the frequency of the electrical signal;
(b) amplifying the lasing pulses; and
(c) detecting with a high-speed photodetector on the substrate the continuous train of mode-locked lasing pulses after amplification thereof for generating the electrical signal.

27. A method of generating an electrical signal at a frequency $\geq 10$ GHz, comprising steps for:
(a) generating in a ring cavity on a substrate a continuous train of mode-locked lasing pulses at the frequency of the electrical signal;
(b) detecting with a high-speed photodetector on the substrate the continuous train of mode-locked lasing pulses and generating the electrical signal therefrom; and
(c) stabilizing the frequency of the electrical signal by feeding back a portion of the electrical signal to a saturable absorber in the ring cavity.

28. Apparatus for generating an electrical signal at a frequency $\geq 10$ GHz, comprising:
(a) a semiconductor ring laser formed on a substrate for generating a continuous train of mode-locked lasing pulses at the frequency of the electrical signal, the semiconductor ring laser further comprising:
(i) a plurality of semiconductor layers formed on the substrate, including a pair of cladding layers sandwiched about an active layer, one of the cladding layers being n-type doped and the other cladding layer being p-type doped to form a semiconductor junction about the active layer;
(ii) a ring cavity formed in the plurality of semiconductor layers, and including a saturable absorber portion and a gain portion and at least one reflection output coupler comprising a pair of oppositely oriented 45-degree reflecting mirrors for coupling the lasing pulses out of the ring cavity in each of a clockwise ring direction and a counterclockwise ring direction; and
(iii) electrodes for electrically activating the gain and saturable absorber portions to generate the train of mode-locked lasing pulses; and
(b) photodetector means located on the substrate proximate to the semiconductor ring laser for detecting the train of lasing pulses and generating the electrical signal therefrom.

* * * * *